United States Patent
Wang et al.

(10) Patent No.: US 9,282,643 B2
(45) Date of Patent: Mar. 8, 2016

(54) CORE SUBSTRATE AND METHOD FOR FABRICATING CIRCUIT BOARD

(71) Applicants: Chin-Sheng Wang, Hsinchu County (TW); Chao-Min Wang, Hsinchu County (TW)

(72) Inventors: Chin-Sheng Wang, Hsinchu County (TW); Chao-Min Wang, Hsinchu County (TW)

(73) Assignee: Subtron Technology Co., Ltd., Hsinchu County (TW)

( * ) Notice: Subject to any disclaimer, the term of this patent is extended or adjusted under 35 U.S.C. 154(b) by 35 days.

(21) Appl. No.: 14/200,046

(22) Filed: Mar. 7, 2014

(65) Prior Publication Data
US 2015/0195917 A1  Jul. 9, 2015

(30) Foreign Application Priority Data
Jan. 3, 2014 (TW) .............................. 103100208 A

(51) Int. Cl.
| | | |
|---|---|---|
| H01L 21/00 | (2006.01) | |
| H01L 23/58 | (2006.01) | |
| H05K 3/00 | (2006.01) | |
| H05K 3/18 | (2006.01) | |

(52) U.S. Cl.
CPC .............. *H05K 3/007* (2013.01); *H05K 3/0097* (2013.01); *H05K 3/188* (2013.01); *H05K 2201/0376* (2013.01); *H05K 2203/1536* (2013.01)

(58) Field of Classification Search
CPC . H01L 21/78; H01L 33/0079; H01L 31/0392; H05K 3/06

USPC .......... 257/635, 750, 762, 766; 438/464, 118, 438/455
See application file for complete search history.

(56) References Cited

U.S. PATENT DOCUMENTS

| 8,181,339 B2* | 5/2012 | Kim ..................... H05K 1/0265 29/830 |
| 2011/0018123 A1* | 1/2011 | An ......................... H01L 21/568 257/693 |

FOREIGN PATENT DOCUMENTS

| TW | 556453 | 10/2003 | |
| TW | 200835411 | 8/2008 | |
| TW | 200944086 | 10/2009 | |
| TW | 201002168 | 1/2010 | |
| TW | 201002168 A * | 1/2010 | ............... H05K 3/42 |
| TW | 201021102 | 6/2010 | |
| TW | 201244567 | 11/2012 | |
| TW | 201248814 | 12/2012 | |
| TW | 201248814 A * | 12/2012 | ............... H01L 23/12 |
| TW | 201332413 | 8/2013 | |

OTHER PUBLICATIONS

"Office Action of Taiwan Counterpart Application", issued on Nov. 6, 2014, p. 1-p. 12.

* cited by examiner

*Primary Examiner* — Calvin Lee
(74) *Attorney, Agent, or Firm* — Jianq Chyun IP Office

(57) ABSTRACT

A core substrate includes a dielectric layer, at least one releasing layer, at least one first copper foil layer and at least one nickel layer. The releasing layer is disposed on the dielectric layer and directly covers the dielectric layer. The first copper foil layer is disposed on the releasing layer and directly covers the releasing layer. The nickel layer is disposed on the first copper foil layer and directly covers the first copper foil layer.

6 Claims, 6 Drawing Sheets

CORE SUBSTRATE AND METHOD FOR FABRICATING CIRCUIT BOARD

CROSS-REFERENCE TO RELATED APPLICATION

This application claims the priority benefit of Taiwan application serial no. 103100208, filed on Jan. 3, 2014. The entirety of the above-mentioned patent application is hereby incorporated by reference herein and made a part of this specification.

BACKGROUND OF THE INVENTION

1. Field of the Invention

The invention relates to a core substrate and a method for fabricating a circuit board. More particularly, the invention relates to a core substrate and a method for fabricating a circuit board that applies the core substrate.

2. Description of Related Art

Generally speaking, when desiring to form a circuit board having an embedded circuit, a core substrate is provided first. This core substrate consists of a dielectric layer, a first copper foil layer and a second copper foil layer that are stacked in sequence, wherein the first copper foil layer directly covers the dielectric layer, and the second copper foil layer directly covers the first copper foil layer. Herein, a thickness of the first copper foil layer is 18 μm, and a thickness of the second copper foil layer is 5 μm. The second copper foil layer may be viewed as an ultra-thin copper foil and has a higher production cost. Next, a patterned circuit layer is formed on the second copper foil layer. Next, an insulating layer is formed on the patterned circuit layer, so as to cover the patterned circuit layer and the second copper foil layer exposed outside the patterned circuit layer. Then, the first copper foil layer and the second copper foil layer are separated from each other by means of a special fixture. Finally, the second copper foil layer is removed by an etching step, so as to expose the insulating layer and the patterned circuit layer, thereby completing fabrication of a conventional circuit board having an embedded circuit.

However, as the cost of the second copper foil layer that is viewed as an ultra-thin copper foil is higher, the production cost of the entire circuit board is increased. Moreover, since a special fixture is required for separating the first copper foil layer and the second copper foil layer from each other, this step further increases the production cost of the entire circuit board by requiring this special fixture. In addition, when removing the second copper foil layer by the etching step, since an etching liquid etches the patterned circuit layer at the same time, surface flatness of the patterned circuit layer is reduced so as to affect structural reliability of the circuit board.

SUMMARY OF THE INVENTION

The invention provides a core substrate that has an advantage of lower cost.

The invention also provides a method for fabricating a circuit board. The method applies the above core substrate, and achieves better surface flatness and structural reliability.

The core substrate of the invention includes a dielectric layer, at least one releasing layer, at least one first copper foil layer and at least one nickel layer. The releasing layer is disposed on the dielectric layer and directly covers the dielectric layer. The first copper foil layer is disposed on the releasing layer and directly covers the releasing layer. The nickel layer is disposed on the first copper foil layer and directly covers the first copper foil layer.

In an embodiment of the invention, a thickness of the first copper foil layer is between 12 μm to 35 μm.

In an embodiment of the invention, the core substrate further includes a second copper foil layer disposed on the nickel layer and directly covering the nickel layer.

In an embodiment of the invention, a thickness of the second copper foil layer is between 5 μm to 35 μm.

The method for fabricating a circuit board of the invention includes the following steps. A core substrate is provided, wherein the core substrate includes a dielectric layer, at least one releasing layer, at least one first copper foil layer and at least one nickel layer. The releasing layer is disposed on the dielectric layer and directly covers the dielectric layer. The first copper foil layer is disposed on the releasing layer and directly covers the releasing layer. The nickel layer is disposed on the first copper foil layer and directly covers the first copper foil layer. At least one patterned circuit layer is formed on the nickel layer, wherein the patterned circuit layer exposes a portion of the nickel layer. At least one insulating layer is formed on the patterned circuit layer, wherein the insulating layer covers the patterned circuit layer and the portion of the nickel layer. A lift-off step is performed to separate the releasing layer from the dielectric layer. A first etching step is performed using the nickel layer as an etching stop layer to remove the first copper foil layer, so as to expose the nickel layer. A peeling step is performed to remove the nickel layer, so as to expose the patterned circuit layer. A top surface of the patterned circuit layer is aligned with an upper surface of the insulating layer.

In one embodiment of the invention, the step of forming the patterned circuit layer includes the following steps. At least one patterned photoresist layer is formed on the nickel layer, wherein the patterned photoresist layer exposes another portion of the nickel layer. The patterned circuit layer is electroplated on the exposed portion of the nickel layer using the nickel layer as an electroplating seed layer. The patterned photoresist layer is removed to expose the portion of the nickel layer.

In an embodiment of the invention, a thickness of the first copper foil layer is between 12 μm to 35 μm.

In an embodiment of the invention, the core substrate further includes a second copper foil layer disposed on the nickel layer and directly covering the nickel layer.

In an embodiment of the invention, a thickness of the second copper foil layer is between 5 μm to 70 μm.

In one embodiment of the invention, the step of forming the patterned circuit layer includes the following steps. At least one patterned photoresist layer is formed on the second copper foil layer, wherein the patterned photoresist layer exposes a portion of the second copper foil layer. The portion of the second copper foil layer exposed outside the patterned photoresist layer is removed using the patterned photoresist layer as an etching mask. The patterned photoresist layer is removed to form the patterned circuit layer.

Based on the above, the core substrate of the invention at least consists of the dielectric layer, the releasing layer, the first copper foil layer and the nickel layer, wherein the costs of the releasing layer, the first copper foil layer and the nickel layer are lower. Therefore, compared to a conventional core substrate that consists of a dielectric layer, a 18 μm first copper foil layer and a 5 μm second copper foil layer, the core substrate of the invention has an advantage of lower cost.

Several exemplary embodiments accompanied with figures are described in detail below to further describe the invention in details.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the invention.

DETAILED DESCRIPTION OF DISCLOSED EMBODIMENTS

Figure 1:
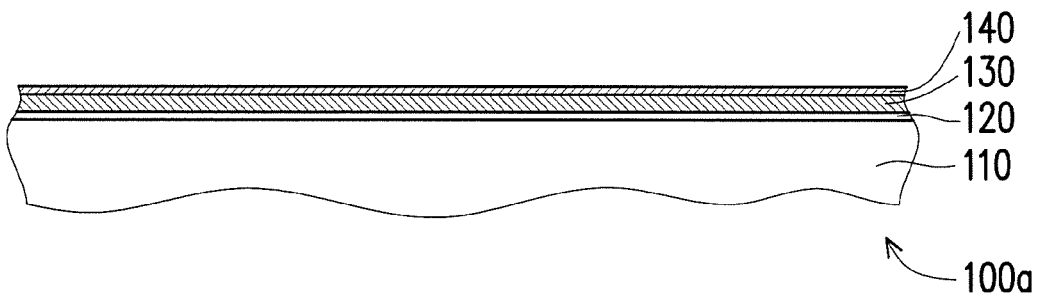
FIG. 1 illustrates a cross-sectional schematic view of a core substrate according to an embodiment of the invention.

FIG. 1 illustrates a cross-sectional schematic view of a core substrate according to an embodiment of the invention. Referring to FIG. 1, in the present embodiment, a core substrate 100a includes a dielectric layer 110, at least one releasing layer 120 (only one is schematically illustrated in FIG. 1), at least one first copper foil layer 130 (only one is schematically illustrated in FIG. 1) and at least one nickel layer 140 (only one is schematically illustrated in FIG. 1).

In detail, the releasing layer 120 of the present embodiment is disposed on the dielectric layer 110 and directly covers the dielectric layer 110. The first copper foil layer 130 is disposed on the releasing layer 120 and directly covers the releasing layer 120. The nickel layer 140 is disposed on the first copper foil layer 130 and directly covers the first copper foil layer 130. More specifically, in the present embodiment, the dielectric layer 110 is, for example, a prepreg (pp), and the releasing layer 120 completely covers a surface of the dielectric layer 110. At this moment, a thickness of the first copper foil layer 130 is preferably, for example, between 12 μm to 35 μm. A thickness of the nickel layer 140 is preferably, for example, between 1 μm to 3 μm.

The core substrate 100a of the present embodiment consists of the dielectric layer 110, the releasing layer 120, the first copper foil layer 130 and the nickel layer 140, wherein the thicknesses of the releasing layer 120, the first copper foil layer 130 and the nickel layer 140 are not special sizes and special materials, and thus these elements have lower costs. Therefore, compared to a conventional core substrate that consists of a dielectric layer, a 18 μm first copper foil layer and a 5 μm second copper foil layer, the core substrate 100a of the present embodiment has an advantage of lower cost. In addition, although the core substrate 100a herein is exemplified by a single-sided board structure, the invention is not limited thereto.

Figure 2:
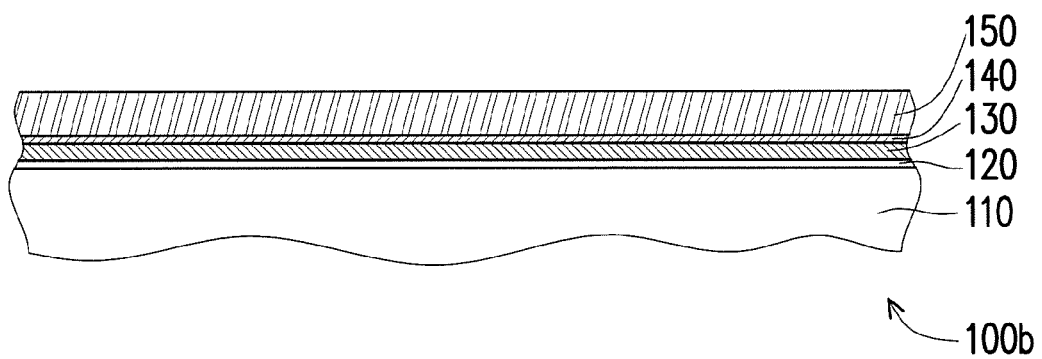
FIG. 2 illustrates a cross-sectional schematic view of a core substrate according to another embodiment of the invention.

FIG. 2 illustrates a cross-sectional schematic view of a core substrate according to another embodiment of the invention. The reference numerals and a part of the content in the aforementioned embodiment are used in the present embodiment, in which identical reference numerals indicate identical or similar components, and repeated description of the same technical content is omitted. For a detailed description of the omitted parts, reference can be found in the aforementioned embodiment, and no repeated description is contained in the present embodiment. Referring to FIG. 2, a core substrate 100b of the present embodiment differs from the core substrate 100a of the aforementioned embodiment mainly in that the core substrate 100b of the present embodiment further includes a second copper foil layer 150, wherein the second copper foil layer 150 is disposed on the nickel layer 140 and directly covers the nickel layer 140. Herein, a thickness of the second copper foil layer 150 is preferably, for example, between 5 μm to 70 μm.

Figure 3:
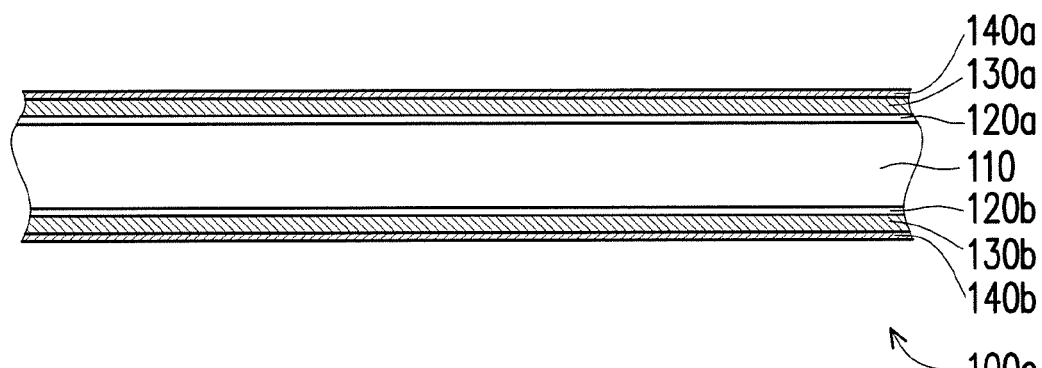
FIG. 3 illustrates a cross-sectional schematic view of a core substrate according to another embodiment of the invention.

FIG. 3 illustrates a cross-sectional schematic view of a core substrate according to another embodiment of the invention. The reference numerals and a part of the content in the aforementioned embodiment are used in the present embodiment, in which identical reference numerals indicate identical or similar components, and repeated description of the same technical content is omitted. For a detailed description of the omitted parts, reference can be found in the aforementioned embodiment, and no repeated description is contained in the present embodiment. Referring to FIG. 3, a core substrate 100c of the present embodiment differs from the core substrate 100a of the aforementioned embodiment mainly in that the core substrate 100c of the present embodiment is substantially a double-sided board structure. In detail, in the present embodiment, the core substrate 100c consists of the dielectric layer 110, two releasing layers 120a and 120b, two first copper foil layers 130a and 130b, and two nickel layers 140a and 140b. The releasing layers 120a and 120b are respectively disposed on two opposing surfaces of the dielectric layer 110. The first copper foil layers 130a and 130b are respectively located on the releasing layers 120a and 120b and directly cover the releasing layers 120a and 120b. The nickel layers 140a and 140b are respectively located on the first copper foil layers 130a and 130b and directly cover the first copper foil layers 130a and 130b.

In the following, a circuit board is fabricated by applying the aforementioned core substrate 100c, and a detailed description is given on a method for fabricating the circuit board of the invention with reference to FIGS. 4A to 4G.

FIGS. 4A to 4G illustrate cross-sectional schematic views of a method for fabricating a circuit board according to an embodiment of the invention. Please refer to FIG. 4A first for the method for fabricating a circuit board according to the present embodiment. First, the core substrate 100c in FIG. 3 is provided, wherein the core substrate 100c consists of the dielectric layer 110, two releasing layers 120a and 120b, two first copper foil layers 130a and 130b, and two nickel layers 140a and 140b. The releasing layers 120a and 120b are respectively disposed on two opposing surfaces of the dielectric layer 110. The first copper foil layers 130a and 130b are respectively located on the releasing layers 120a and 120b and directly cover the releasing layers 120a and 120b. The nickel layers 140a and 140b are respectively located on the first copper foil layers 130a and 130b and directly cover the first copper foil layers 130a and 130b. Herein, a thickness of the first copper foil layer 130a (or 130b) is preferably, for example, between 12 μm to 35 μm, while a thickness of the nickel layer 140a (or 140b) is preferably, for example, between 1 μm to 3 μm.

Figure 4A:
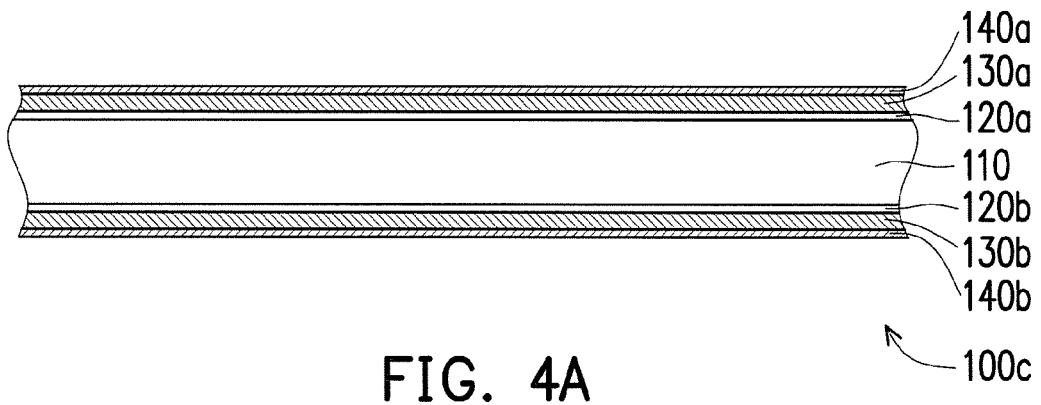
FIGS. 4A to 4G illustrate cross-sectional schematic views of a method for fabricating a circuit board according to an embodiment of the invention.
Figure 4B:
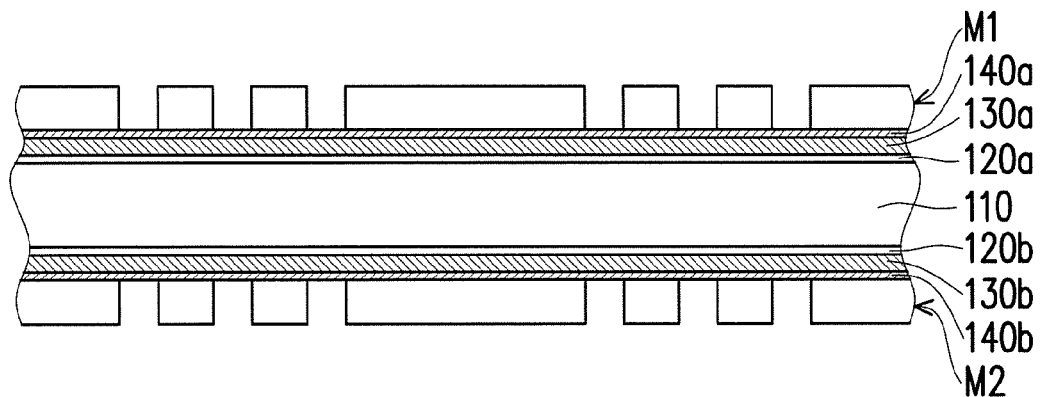
Figure 4C:
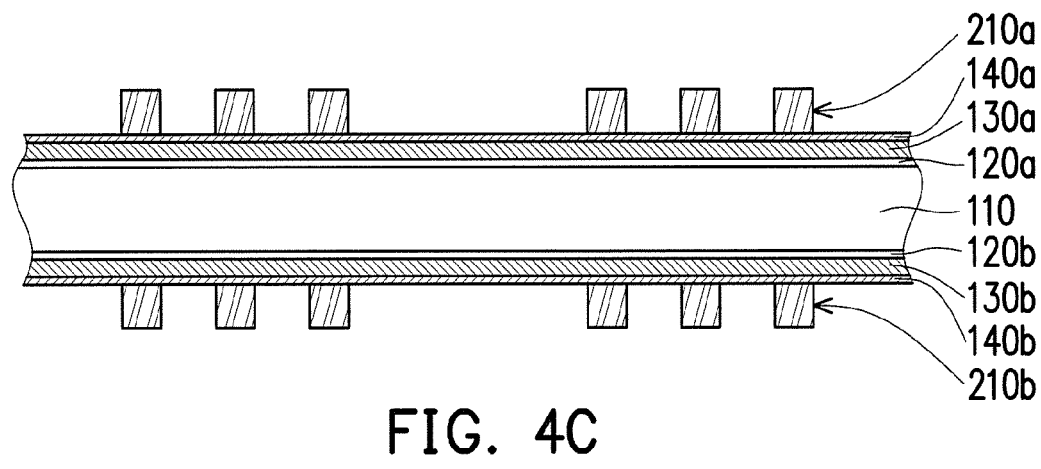

Next, referring to FIGS. 4B and 4C, at least one patterned circuit layer (two patterned circuit layers 210a and 210b are schematically illustrated in FIG. 4C) is formed on the nickel layers 140a and 140b, wherein the patterned circuit layers 210a and 210b expose a portion of the nickel layers 140a and 140b. In detail, referring to FIG. 4B, at least one patterned photoresist layer (two patterned photoresist layers M1 and M2 are schematically illustrated in FIG. 4B) is formed on the nickel layers 140a and 140b, wherein the patterned photoresist layers M1 and M2 respectively expose another portion of the nickel layers 140a and 140b. At this moment, the patterned photoresist layers M1 and M2 are respectively directly disposed on the nickel layers 140a and 140b. Next, referring to FIG. 4C, the patterned circuit layers 210a and 210b are electroplated on the exposed portion of the nickel layers 140a and 140b using the nickel layers 140a and 140b as an electroplating seed layer. Then, the patterned photoresist layers M1 and M2 are removed to expose the portion of the nickel layers 140a and 140b, as shown in FIG. 4C. Up to this step, the patterned circuit layers 210a and 210b have been formed on the nickel layers 140a and 140b.

Figure 4D:
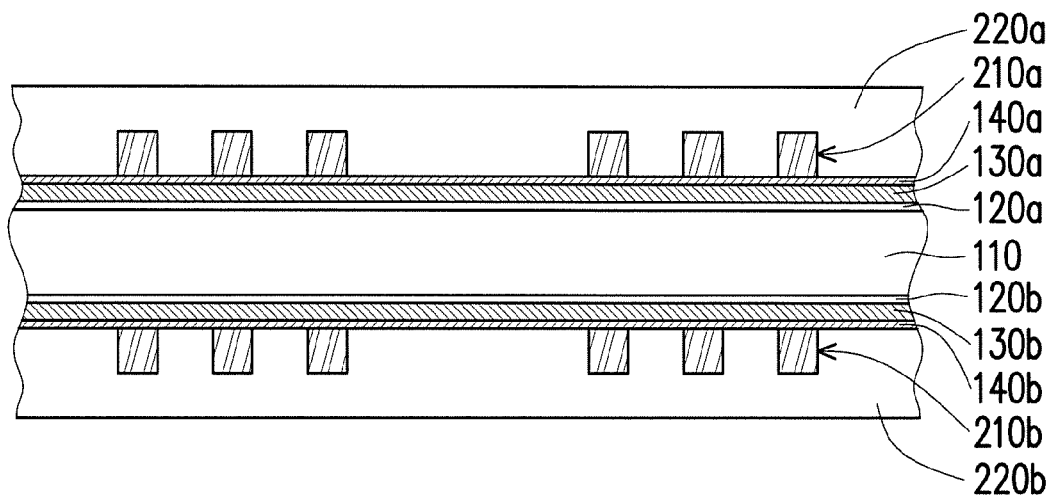

Next, referring to FIG. 4D, at least one insulating layer (two insulating layers 220a and 220b are schematically illustrated in FIG. 4C) is formed on the patterned circuit layers 210a and 210b, wherein the insulating layers 220a and 220b respectively cover the patterned circuit layers 210a and 210b as well as the portion of the nickel layers 140a and 140b.

Figure 4E:
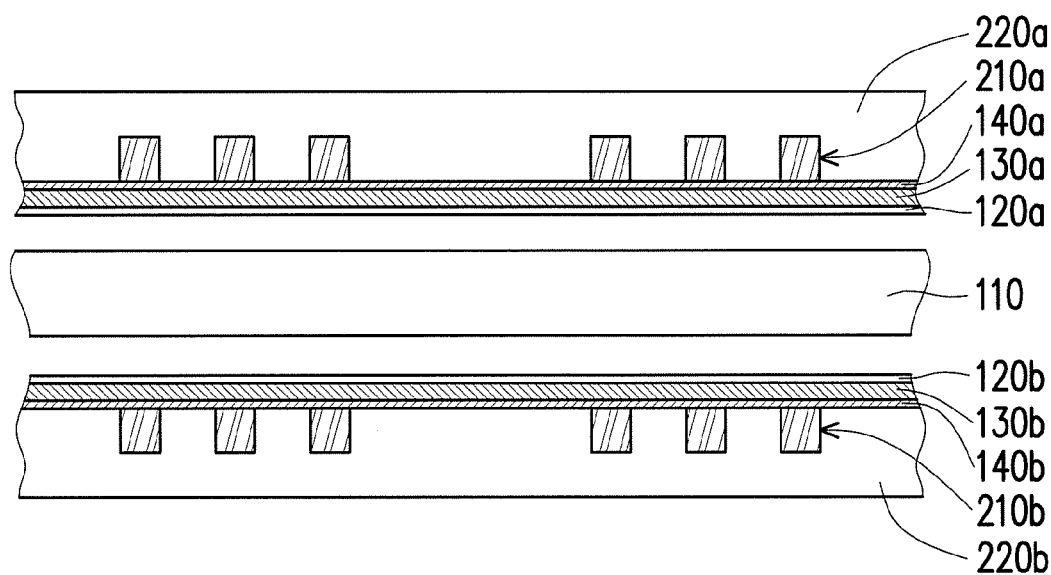

Next, referring to FIG. 4E, a lift-off step is performed to separate the releasing layers 120a and 120b from the dielectric layer 110.

Figure 4F:
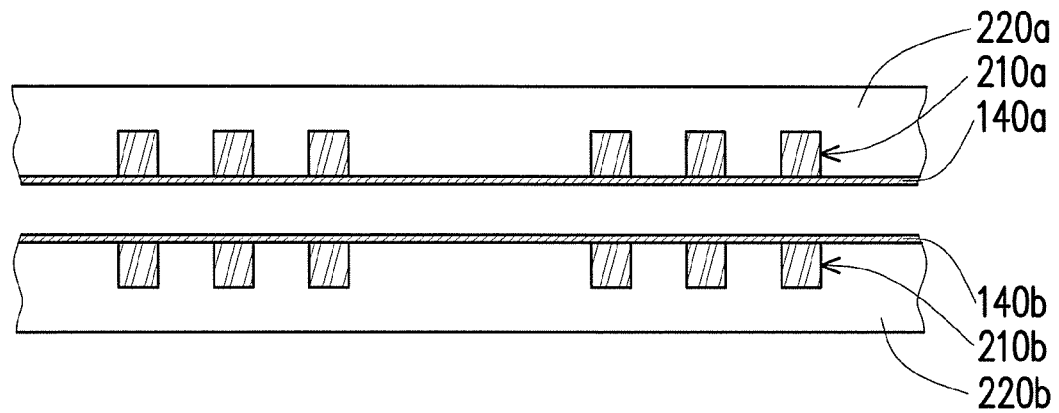

Next, referring to FIGS. 4E and 4F together, a first etching step is performed using the nickel layers 140a and 140b as an etching stop layer to remove the first copper foil layers 130a and 130b, so as to expose the nickel layers 140a and 140b.

Figure 4G:
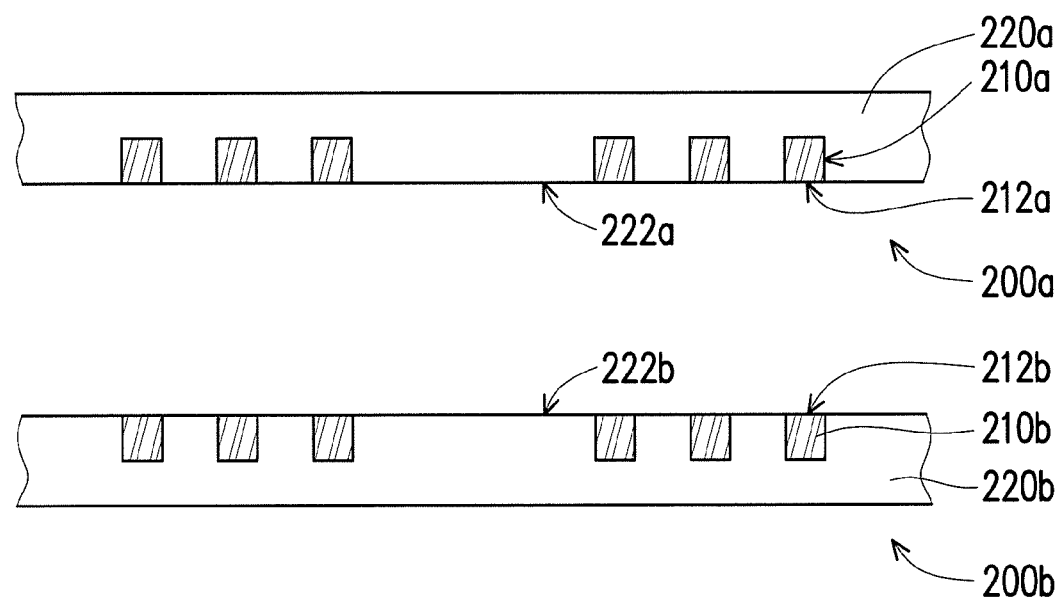

Finally, referring to FIG. 4G, a peeling step is performed to remove the nickel layers 140a and 140b, so as to expose the patterned circuit layers 210a and 210b. At this moment, top surfaces 212a and 212b of the patterned circuit layers 210a and 210b are substantially aligned with upper surfaces 222a and 222b of the insulating layers 220a and 220b. Up to this step, fabrication of circuit boards 200a and 200b having an embedded circuit (i.e. the patterned circuit layers 210a and 210b) is completed.

Since the circuit boards 200a and 200b of the present embodiment are fabricated by means of the core substrate 100c, the releasing layers 120a and 120b may be separated from the dielectric layer 110 through lift-off. Next, when removing the first copper foil layers 130a and 130b by etching, the nickel layers 140a and 140b are viewed as an etching stop layer, so as to prevent the patterned circuit layers 210a and 210b from being etched by an etching liquid (not illustrated). Finally, the nickel layers 140a and 140b are removed by peeling so that the structures and surface flatness of the patterned circuit layers 210a and 210b are not destroyed at all. In brief, the circuit boards 200a and 200b of the present embodiment have better surface flatness and structural reliability.

FIGS. 5A to 5D illustrate cross-sectional schematic views of a method for fabricating a circuit board according to another embodiment of the invention. The reference numerals and a part of the content in the aforementioned embodiment are used in the present embodiment, in which identical reference numerals indicate identical or similar components, and repeated description of the same technical content is omitted. For a detailed description of the omitted parts, reference can be found in the aforementioned embodiment, and no repeated description is contained in the present embodiment. Please refer to FIG. 5A first for the method for fabricating a circuit board according to the present embodiment. First, a core substrate 100d is provided. The core substrate 100d is similar to the core substrate 100c of the aforementioned embodiment, and they are different mainly in that the core substrate 100d of the present embodiment further includes two second copper foil layers 150a and 150b, wherein the second copper foil layers 150a and 150b are disposed on the nickel layers 140a and 140b and directly cover the nickel layers 140a and 140b.

Herein, a thickness of the second copper foil layer 150a (or 150b) is preferably, for example, between 5 μm to 70 μm.

Figure 5A:
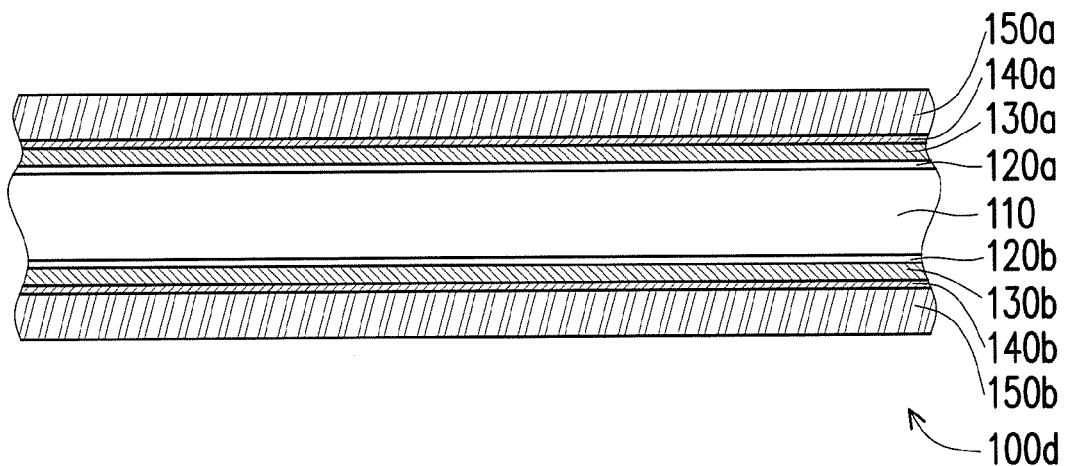
FIGS. 5A to 5D illustrate cross-sectional schematic views of a method for fabricating a circuit board according to another embodiment of the invention.
Figure 5B:
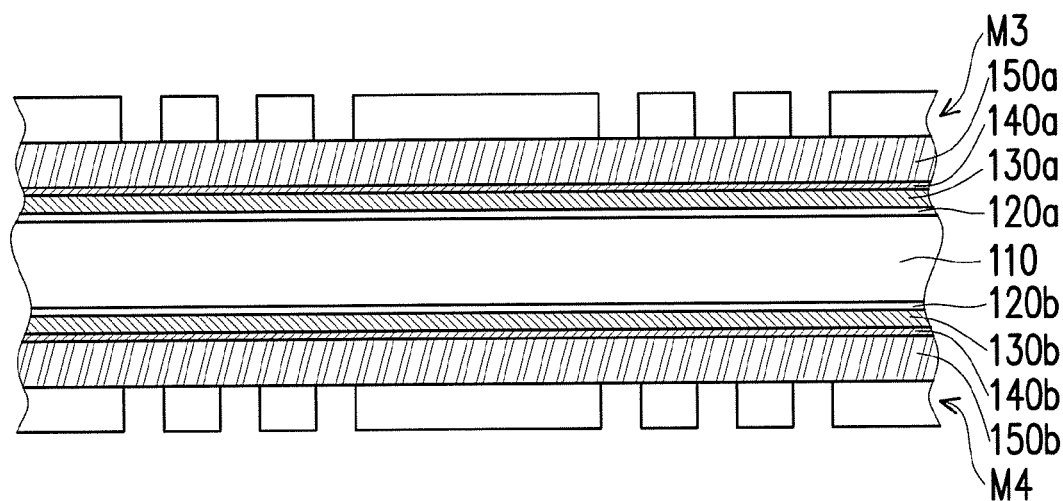

Next, referring to FIG. 5A, at least one patterned photoresist layer (two patterned photoresist layers M3 and M4 are schematically illustrated in FIG. 5B) is formed on the second copper foil layers 150a and 150b, wherein the patterned photoresist layers M3 and M4 respectively expose a portion of the second copper foil layers 150a and 150b.

Figure 5C:
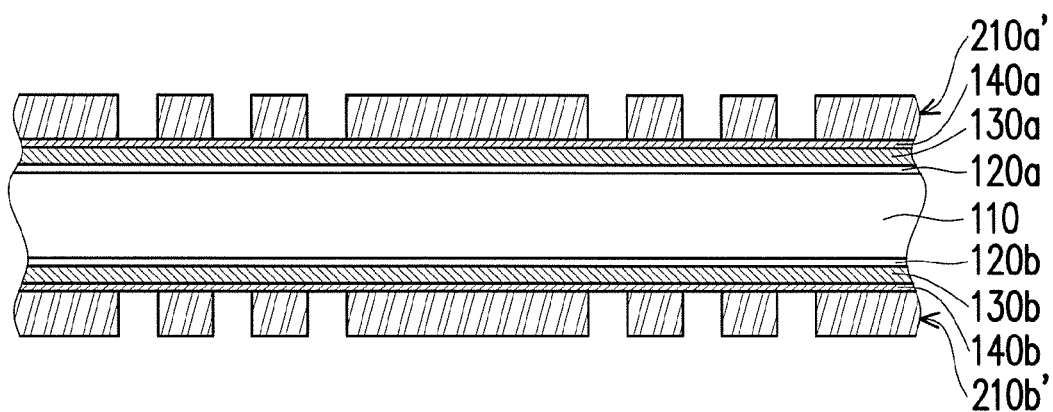
Figure 5D:
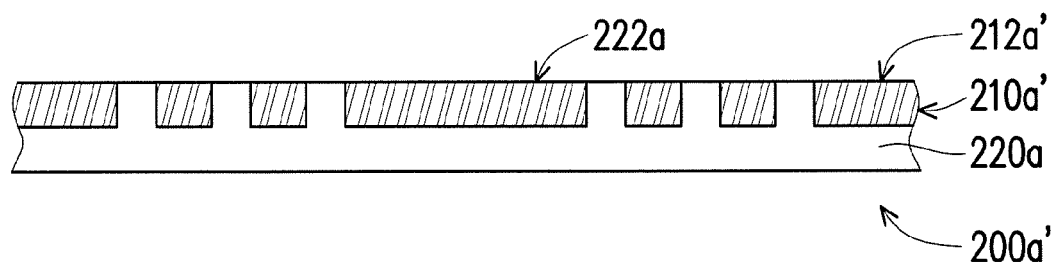

Next, referring to FIGS. 5B and 5C together, the portion of the second copper foil layers 150a and 150b exposed outside the patterned photoresist layers M3 and M4 is removed using the patterned photoresist layers M3 and M4 as an etching mask. Next, the patterned photoresist layers M3 and M4 are removed to form patterned circuit layers 210a' and 210b' respectively on the nickel layers 140a and 140b. Then, according to the steps described in FIGS. 4D to 4F, fabrication of a circuit board 200a' in FIG. 5D is completed. It is to be noted that for ease of illustration, only one circuit board 200a' is schematically illustrated in FIG. 5D. At this moment, a top surface 212a' of a patterned circuit layer 210a' is substantially aligned with the upper surface 222a of the insulating layer 220a.

It is worth mentioning that in other embodiments which are not illustrated, the core substrates 100a and 100b mentioned in the aforementioned embodiments may also be adopted. It is obvious that persons skilled in the art may adopt the aforementioned members by referring to the descriptions of the aforementioned embodiments according to actual needs, so as to achieve desired technical effects.

In summary, the core substrate of the invention at least consists of the dielectric layer, the releasing layer, the first copper foil layer and the nickel layer, wherein the costs of the releasing layer, the first copper foil layer and the nickel layer are lower. Therefore, compared to a conventional core substrate that consists of the dielectric layer, the 18 μm first copper foil layer and the 5 μm second copper foil layer, the core substrate of the invention has an advantage of lower cost. In addition, the circuit board fabricated by employing the core substrate of the invention has better surface flatness and structural reliability.

It will be apparent to those skilled in the art that various modifications and variations can be made to the structure of the disclosed embodiments without departing from the scope or spirit of the invention. In view of the foregoing, it is intended that the disclosure cover modifications and variations of this specification provided they fall within the scope of the following claims and their equivalents.

What is claimed is:

1. A method for fabricating a circuit board, comprising:
providing a core substrate, the core substrate comprising:
a dielectric layer;
two releasing layers disposed on the dielectric layer and respectively and directly covering two side surfaces of the dielectric layer;
two first copper foil layers respectively disposed on the releasing layers and directly covering the releasing layers; and
two nickel layers respectively disposed on the first copper foil layers and directly covering the first copper foil layers;
forming two patterned circuit layers respectively on the nickel layers, wherein the patterned circuit layers expose portions of the nickel layers;
forming two insulating layers respectively on the patterned circuit layers, wherein the insulating layers cover the patterned circuit layers and the portions of the nickel layers;

performing a lift-off step to separate the releasing layers from the dielectric layer;

performing a first etching step using the nickel layers as etching stop layers to remove the first copper foil layers so as to expose the nickel layers; and performing a peeling step to remove the nickel layers so as to expose the patterned circuit layers, wherein top surfaces of the patterned circuit layers are aligned with upper surfaces of the insulating layers.

2. The method for fabricating a circuit board as claimed in claim 1, wherein the step of forming the patterned circuit layers comprises:

forming two patterned photoresist layers respectively on the nickel layers, wherein the patterned photoresist layers expose another portions of the nickel layers;

electroplating the patterned circuit layers on the another portions of the nickel layers using the nickel layers as electroplating seed layers; and removing the patterned photoresist layers to expose the portions of the nickel layers.

3. The method for fabricating a circuit board as claimed in claim 1, wherein a thickness of each of the first copper foil layers ranges from 12 μm to 35 μm.

4. The method for fabricating a circuit board as claimed in claim 1, wherein the core substrate further comprises two second copper foil layers respectively disposed on the nickel layers and directly covering the nickel layers.

5. The method for fabricating a circuit board as claimed in claim 4, wherein a thickness of each of the second copper foil layers ranges from 5 μm to 70 μm.

6. The method for fabricating a circuit board as claimed in claim 4, wherein the step of forming the patterned circuit layers comprises:

forming two patterned photoresist layers respectively on the second copper foil layers, wherein the patterned photoresist layers expose portions of the second copper foil layers;

removing the portions of the second copper foil layers exposed outside the patterned photoresist layers using the patterned photoresist layers as etching masks; and removing the patterned photoresist layers to form the patterned circuit layers.

\* \* \* \* \*